United States Patent [19]

Vincelli et al.

[11] 4,262,248
[45] Apr. 14, 1981

[54] SYSTEM FOR SERVICING PROCESS INSTRUMENTATION

[75] Inventors: Joseph Vincelli, Pittsford; Donald P. Persons, Webster, both of N.Y.

[73] Assignee: Sybron Corporation, Rochester, N.Y.

[21] Appl. No.: 958,806

[22] Filed: Nov. 8, 1978

[51] Int. Cl.³ .......................................... G01R 15/12
[52] U.S. Cl. ............................. 324/73 R; 324/158 F
[58] Field of Search ............. 324/73 PC, 158 F, 73 R

[56] References Cited

U.S. PATENT DOCUMENTS

| 2,815,484 | 12/1957 | Bulliett et al. | 324/73 R |
| 2,985,819 | 5/1961 | Russell | 324/73 R |
| 3,137,815 | 6/1964 | Hershey | 324/73 PC |
| 3,657,527 | 4/1972 | Kassabgi et al. | 324/73 PC |

*Primary Examiner*—Michael J. Tokar
*Attorney, Agent, or Firm*—Theodore B. Roessel; Joseph C. MacKenzie

[57] ABSTRACT

An electronic circuitry servicing system having an operations manual setting forth servicing procedures such as function checking, troubleshooting, and calibration, a template fitting on the circuit being serviced and providing probe access to test points of the surface and graphic information about the circuit and a test fixture for coordinating test signals and measurements.

3 Claims, 4 Drawing Figures

1.3 THE TEST FIXTURE 1.3 THE TEST FIXTURE 1.3 THE TEST FIXTURE

SYSTEM FOR SERVICING PROCESS INSTRUMENTATION

BACKGROUND OF THE INVENTION

In servicing instrumentation for the measurement, control, etc., of process variables, personnel of relatively modest skills and attainments are entrusted with such servicing tasks as calibration, maintenance, troubleshooting and repair of electronic circuitry in said instrumentation.

In the prior art, simple input/output board function checks allow easy service at the board level, provided, however, that repairs, adjustments, etc., are confined to merely replacing entire misbehaving, maladjusted, or inoperative circuit boards. But such service is costly and, we have found, nevertheless requires a degree of skill sufficient for more ambitions tasks such as troubleshooting and repair on the component level, as by finding and replacing defective parts and calibrating by adjusting circuit elements.

Also known to the prior art are templates, overlays, etc. which can be fixed temporarily or permanently to circuit boards, and have thereon graphic illustration of circuitry: verbal instructions and legends, parts symbols, numbers, pictures, values, operating parameters, etc., with or without depictions of circuit interconnections; and/or other information relating to servicing or operation of the circuitry in question. While this avoids the cost of the circuit-board replacement approach to service, such template approaches as we are aware of are not suitable for servicing complex electronic circuitry such as process instrumentation, because the level of skill, at which the present invention is aimed, needs more than templates and test instruments, in order to do the job of servicing reliably and efficiently.

SUMMARY OF THE INVENTION

The present invention provides a service system comprising service manual, template, and test fixture. The manual presents focused, step-by-step procedures for locating and correcting malfunctions, and the template and test fixture are coordinated with said procedures, for providing functional checks, calibration, signal measurements, and so forth, with respect to various points and components, either on the circuit board or elsewhere in the controller.

The service manual preferably begins with a general description of the service system, and statement of user advantages, for example:

"TAYLOR SERVICE MATE (TM)"

"The Taylor Service Mate System provides equipment and procedures for testing, troubleshooting, repair and calibration of Taylor 1300 Series Instruments. The Taylor Service Mate System consists of
- The text fixture.
- Templates for circuit board troubleshooting.
- Service kit of tools and replacement components.
- Instructions containing troubleshooting and calibration procedures and a parts list of electronic components.

The advantage of using the Service Mate System are
- Reduces MTTR (Mean time to repair).
- More convenient to use than individual test instruments, wires, terminals, resistors, etc.
- Provides for repair to the component level.
- Does not require a highly skilled electronics technician.
- Eliminates return of instrument to factory for repair.
- Can be used as a training aid for new or inexperienced technicians."

While the recitation of advantages may appear to be somewhat self-serving, we believe the textual material here, as a whole, inculcates in the user a systems orientation or attitude which helps make the "advantages" recited come true for the user.

Figure 1:
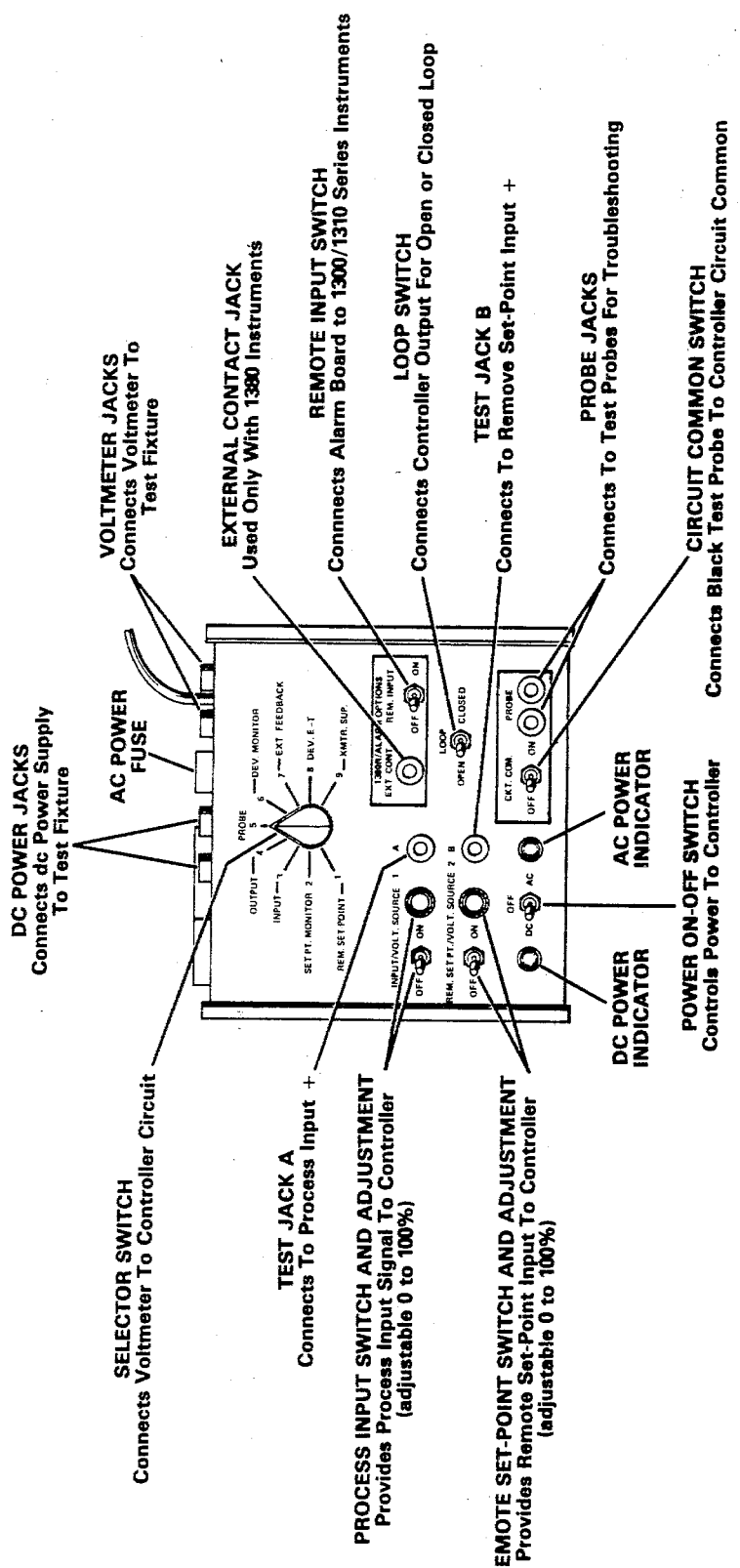
FIGS. 1, 2 and 3 reproduce, a little less than full-scale, three pages of a service manual, according to the invention.

Another page (not shown) has a sort of inventory of the system, along with ample space for ad hoc additions by the user, for particular cases having requirements for tools, instruments or other items, not provided in the standard service system. A text fitting the present example is:

1. Templates:
   T-1301R-1 for controller circuit board
   T-1301R-50 for Model A manual control circuit board (125S886)
   T-1301R-51 for Model B manual control circuit board (125S1036)
2. Test Fixture
3. Precision Voltmeter with test leads: 0 to 50 V ac and dc, 0.001 V dc accuracy at 1 V dc
4. Ohmmeter
5. Service Kit: Contains tools and spare components
6. Additional Tools: As required to service instrument FIG. 1 shows the face of a test fixture, and provides legendry which will explain to the user the features of the test fixture in different or in somewhat different terms than shown on the face of the test fixture.

FIG. 2D shows the manual page which illustrates a template according to the invention, and again suitable legends expand upon what is evident from the face of the template. For example, the legend "Main Amplifier Area (Red)" and other color-associated legends, and the "COLOR CODE" at the lower left corner of the template reinforce the significance of the fact that the circuitry, insofar as shown, is actually depicted in a particular color. Thus, the dashed line around the "Main Amplifier Area" is red, as are diodes D3 et al, and the other circuit elements depicted within that outline. Preferably, if the printed-circuit interconnections on the board are illustrated, they are shown in a uniform, low-saturation color, like grey, which contrasts with the more vivid hues used for the other graphic elements: letters, numbers, circuit element outlines.

For the user's convenience in adding ad hoc notes in pen or ink, as well as for visibility and durability, the template surface may be coated with a matte finish plastic. However, graphic complexity is inadvisable, and, according to invention we provide substantially only such information on the template as will be necessary in carrying out the procedures set forth in the service manual. The gray interconnections are an exception to this exclusionary aspect of the template graphics, for the reason that, in principle, it is also desirable to know circuit commons and the general lay of the land so to speak. However, an unobtrusive color can be used for these purposes without interfering or confusing the intended service procedures.

Another page (not shown) depicts the layout of the trays of a spare parts and tool kit which can be used to augment a service system accordingly. The contents of the trays are preferably coordinated with the service manual and test fixture.

Still another page (not shown) is confined to information relating to template selection for a particular instrument. Again, generous room is provided for adding ad hoc information, should the user find it desirable to do so.

Figure 2:
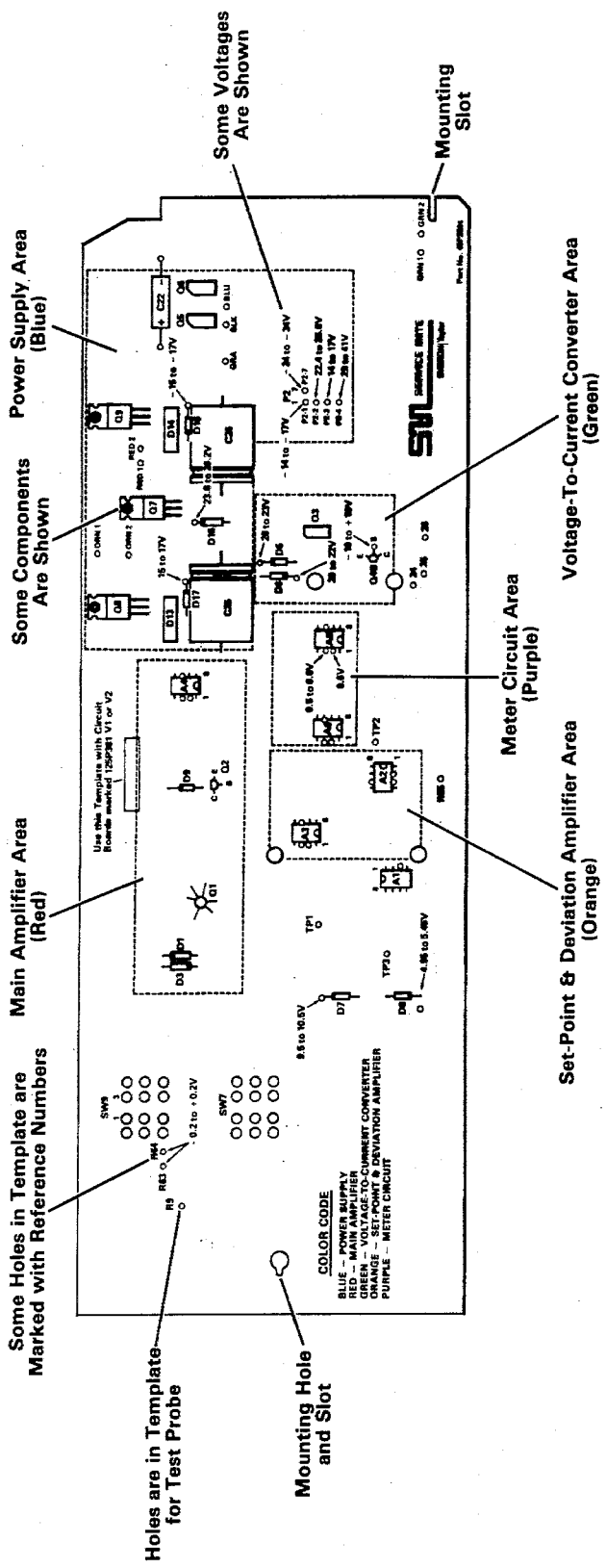

Additional pages (not shown) are provided describing or attaching a template to the "manual control circuit board" of a process controller, as well as attaching the FIG. 2 template to the controller circuit board of the process controller.

Figure 3:
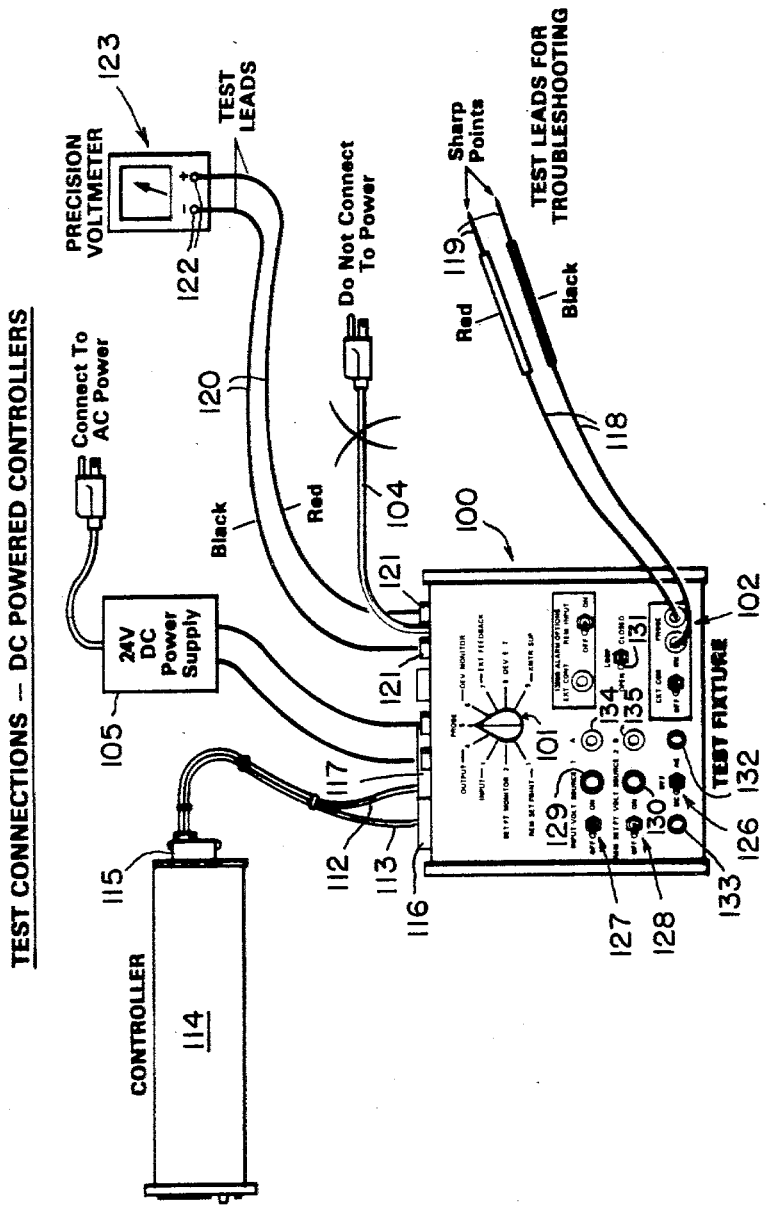

FIG. 3 shows the service manual pages illustrating the servicing set-up for DC-powered controllers. Also, the DC scheme shows an AC line cord, as well as the DC supply (which is actually itself a plug-in) because the same actual test fixture also provides for a quite similar AC-powered controller servicing set-up.

A following page (not shown) orients the user to the specific procedures of troubleshooting and focuses on a particular instrument, namely, assignee's Taylor Instrument Company Division 1312 Indicating Controllers with Full View Scale, Models A and B. This controller family is of the well-known PID type based on "operational amplifier" principles, for example, as set forth in our assignee's U.S. Pat. No. 3,127,109 to N. B. Nichols. A suitable text is:

"TROUBLESHOOTING" with Controller Text Fixture for Taylor 1312R Indicating Controllers with Full View Scale Models A and B

NOTE

"The following troubleshooting procedures are for component failure in one section of the circuit. If components fail in more than one section of circuitry, a combination of the following procedures will be required. Most components that fail will be diodes, transistors, integrated circuits, switches and meters.

The circuit boards are coated with varnish. To remove and replace components the varnish must be removed by scraping or burning it off with a soldering iron. After the component has been replaced and any necessary testing or calibration is completed, the area where the varnish was removed should be cleaned and revarnished."

Following this are pages (not shown) which self-explanatorily illustrate, verbally and pictorially, further preliminaries to beginning the troubleshooting, e.g., checking for broken wires, and burned or otherwise physically damaged components, overheating when turned-on, and putting the instrument into condition for service, as by jumpering the controller internal feedback circuit, and making response and other operational settings which are appropriate for servicing.

These preliminaries continue with "Controller Function Check", a purely verbal procedure, quoted hereinbelow as running text, but, in the manual, more comfortably spread over 9 service manual pages which, except for lacking drawings, is formatted like the pages illustrated herein.

"The following function check is a symptom analysis procedure which isolates a circuit problem to a section of the circuitry. Each section of circuitry has a separate troubleshooting procedure which isolates the defective component, e.g, diode, transistor, integrated circuit, switch or meter."

"This procedure will indicate if controller is functioning correctly. Incorrect calibration will affect instrument operation. Always check instrument calibration before replacing any component. After component replacement, check controller calibration and operation. Make sure controller is operating correctly before putting it back into service.

(1) At controller: Set auto-manual switch at M (manual).
(2) At test fixture: Set selector switch at OUTPUT. Set loop switch at OPEN. Set circuit common switch at OFF.
(3) At controller: Depress and hold OUT button. At same time, depress and hold both up button ($\nabla$) and fast button (F) until output pointer (left pointer) reaches top of meter scale (changes at about 15% per second). Release both up and fast buttons. Then, depress and hold down button ($\Delta$) and fast button (F) until output pointer reaches bottom of meter scale (changes at about 15% per second). Output indicator (left pointer) should move to top of meter scale (100%) and then to bottom of meter scale (0%).
(4) At voltmeter: From 0.25 V dc (when output pointer is at bottom of scale) to 1.25 V dc (when output pointer is at top of scale).
  If not, controller does not operate correctly when in manual control.
(5) At controller: Set auto-manual switch at A (auto). Set remote-local switch at L(local).
(6) At test fixture: Set loop switch at CLOSED.
(7) At controller: Vary set-point from 0 to 100%.
  Set-point indicator (right pointer) Should follow set-point adjustment.
  Process pointer (left pointer) should follow set-point indication (right pointer).
  Output indicator (left pointer) should move to top of meter scale (100%) and then to bottom of meter scale (0%).
  If not, controller does not operate correctly when in automatic control.
(8) At voltmeter: From 0.25 V dc (when output pointer is at bottom of scale) to 1.25 V dc (when output pointer is at top of scale).
  If not, controller does not operate correctly when in automatic control.
(9) At test fixture: Set selector switch at SET-POINT MONITOR.
(10) At controller: Vary set-point from 0 to 100%.
(11) At voltmeter: 0.25 to 1.25 V dc. If not, set-point monitor signal is incorrect.
(12) At test fixture: Set selector switch at INPUT. Set loop switch at OPEN. Set input/voltage source 1 switch at ON.
  Vary input/voltage source 1 potentiometer until voltmeter indicates 0.75 V dc+0.001.
(13) At test fixture: Set selector switch at DEVIATION MONITOR.
(14) At controller: Vary set-point from 0 to 100%.

(15) At voltmeter: Deviation monitor signal should be Approx. −0.5 V dc when set-point is at 0%. Approx. 0 V dc when set-point is at 50%. Aprox. +0.5 V dc when set-point is at 100%. If not, deviation monitor signal is incorrect.
(16) At test fixture: Set selector switch at EXTERNAL FEEDBACK.
(17) At controller: Vary set-point from 0 to 100%.
(18) At voltmeter: Feedback signal should be Approx. +10 V dc when set-point is at 0%. Approx. 0 V dc when set-point is at 50%. Approx. −10 V dc when set-point is at 100%. If not, feedback signal is incorrect.
(19) At controller: If controller does not have remote-local switch, go to Step 22. If controller has remote-local switch, set remote-local switch at R (remote).
(20) At test fixture: Set selector switch at DEVIATION MONITOR. Set remote set-point/voltage source 2 switch at ON. Set remote set-point/voltage source 2 potentiometer to get 0, 50 and 100% of set-point indicator (right pointer).
(21) At voltmeter: Approx. −0.5 V dc when set-point indicator is at 0%. Approx. 0 V dc when set-point indicator is at 50%. Approx. +0.5 V dc when set-point indicator is at 100%.
If not, controller does not operate correctly from remote set-point signal.
(22) At test fixture: Set selector switch at XMTR SUP. Set remote set-point switch at OFF. Set input/voltage source 1 switch at OFF.
(23) At voltmeter: Between 24.25 and 25.75 V dc
If not, transmitter power supply is defective."

"When controller operates in both auto (Step 7) and manual (Step 4) except for the following:

No output indication (Steps 4 and 8)—Refer to 9 Troubleshooting Process-Output Meter Circuit.
No Process indication (Step 7)—Refer to 9 Troubleshooting Process-Output Meter Circuit.
No Set-Point indication (Step 7)—Refer to 8 Troubleshooting Set-Point Meter Circuit.
No Set-Point monitor signal (Step 11)—Refer to 10 Troubleshooting Set-Point Buffer Amplifier Circuit.
Will not operate from remote set-point signal (Step 21)—Refer to 3 Troubleshooting Remote-Local Switch.
No transmitter power supply voltage (Step 23)—Refer to 16 Troubleshooting Transmitter Power Supply."

"When controller operates in manual (Step 4) but not in auto (Step 7):

Incorrect deviation monitor signal (Step 15)—Refer to 4 Troubleshooting Deviation Amplifier Circuit.
Incorrect set-point monitor signal (Step 11)—Refer to 2 Troubleshooting Set-Point Adjustment."

"When controller operates in manual (Step 4) and in auto with the remote set-point signal (Step 21), but not with the local set-point (Step 11):

When controller does not operate in either auto (Step 7) or manual (Step 4):
Refer to 2 Troubleshooting Set-Point Adjustment."

"When controller operates in auto but not in manual:

Refer to 11 Troubleshooting Manual Control Switch Circuit
Refer to 12 Troubleshooting Relay K101
Refer to 13 Troubleshooting Manual Amplifier Circuit (Model A Controllers).
Refer to 14 Troubleshooting Manual Amplifier Circuit (Model B Controllers).
Refer to 15 Troubleshooting Manual Buffer Amplifier Circuit."

"When controller does not operate in either auto (Step 7) or manual (Step 4):

Set-point monitor (Step 11), deviation monitor (Step 15) and feedback signals (Step 18) are correct—Refer to 1 Troubleshooting Power Supply Circuit and 7 Troubleshooting Voltage-to-Current Converter.
Incorrect feedback signal (Step 18)—Refer to 1 Troubleshooting Power Supply Circuit, 5 Troubleshooting Main Amplifier Circuit and 6 Troubleshooting Diode Limiter Circuit."

The foregoing function checking is diagnostic in nature and leads to the following specific procedures:
(1) Troubleshooting Power Supply Circuit
(2) Troubleshooting Set-Point Adjustment
(3) Troubleshooting Remote-Local Switch
(4) Troubleshooting Deviation Amplifier Circuit
(5) Troubleshooting Main Amplifier Circuit
(6) Troubleshooting Diode Limiter Circuit
(7) Troubleshooting Voltage-To-Current Converter
(8) Troubleshooting Set-Point Meter Circuit
(9) Troubleshooting Process-Output Meter Circuit
(10) Troubleshooting Set-Point Buffer Amplifier Circuit
(11) Troubleshooting Manual Control Switch Circuit
(12) Troubleshooting Relay K101
(13) Troubleshooting Manual Amplifier Circuit (Model A Controllers)
(14) Troubleshooting Manual Amplifier Circuit (Model B Controllers)
(15) Troubleshooting Manual Buffer Amplifier Circuit
(16) Troubleshooting Transmitter Power Supply Inasmuch as the service manual pages for these procedures will be formatted in accordance with the pages previously described, showing the troubleshooting procedure pages or describing their content is unnecessary, especially since we do not regard the details of procedures themselves as part of the invention we seek to patent here.

The service manual also includes pages describing the various calibration procedures, detailed circuit component location diagrams, and parts lists, and as in the case of troubleshooting procedures, and for the same reasons, we do not show service manual pages devoted to the calibration procedures. These Figures are individually self-explanatory, etc.

Figure 4:
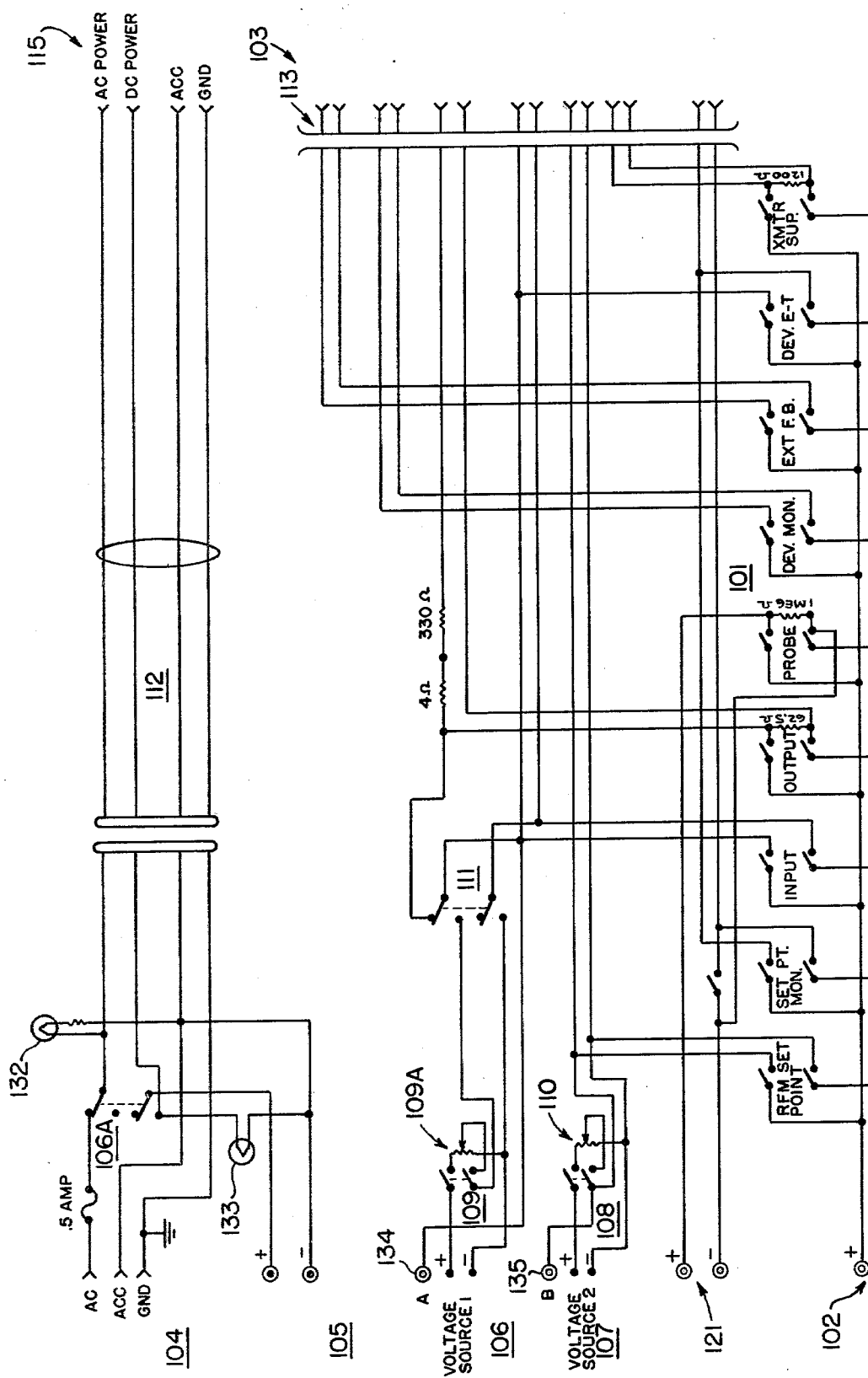
FIG. 4 shows the circuitry of a test fixture, according to the invention.

Referring now to FIGS. 3 and 4, the function switch 101 of the former is represented in the latter by nine labeled double-pole, single throw switches, which preferably are actually provided in the form of the usual rotary switched having ganged contact wafers (not shown).

For the most part, switch 101 selectively connects jacks 102 and pin contacts 103, comprising pairs wherein; the second of each pair is either at circuit common or negative potential, and wherein the jack voltage will represent, respectively, the controller's external feedback voltage, the deviation of the process variable from the set point value desired for it, the controller's output and input voltages, the value of a remote set point, transmitter output voltage and the active set point of the control (to which the remote set point would normally an alternative).

The voltages at jacks 102 can be traced back ultimately to one or another of sources 104, 105, 106 and 107, respectively an AC line cord, a 24 V DC power supply, and first and second 1.5 volt batteries (not shown, but normally mounted in the case 100 of test fixture). Selection of sources 104 and 105 is by means of a single-pole, double throw switch 106A having an intermediate off-position wherein both sources are disconnected. In a manner of speaking, selection is also controlled by service manual directions for line-cord plug-in.

Double pole, single throw switches 109 and 108, and potentiometers 109A and 110, respectively, provide adjustable input voltage across one pair of pins 103 and remote set point voltage across another pair thereof. Double pole, single throw switch 111 provides for alternative open-loop and closed-loop testing.

Cables 112 and 113 provide for connecting power and test signals between the controller 114 and the test fixture 100. In the former case, these signals are applied via plug-in connection 115 to the regular instrument terminals via which process information and control signals pass between controller and the process it is controlling and via which the controller is energized in order to power its controlling and signal handling capabilities.

Cables 112 and 113 connect to the test fixture circuitry via connectors 116 and 117 of any suitable form.

Into jacks 102 are removably plugged leads 118 of test probes 119. Other leads 120 are removably plugged into jacks 121 of the test fixture for connecting test fixture circuitry to the input terminals 122 of a voltmeter 123.

In FIG. 3, references numerals 126 through the 131 respectively identify the operating hardware (e.g., toggles) of switches 106, 107 and 108, operating hardward (e.g., rotatable knobs) of potentiometers 109A and 110, and the operating hardward of switch 111. In addition, respective pilot lights 132 and 133 are provided for indicating whether any, and which, power is on pins of the instrument connection 115.

Finally, the test fixture provides a jack 134 and a jack 135 into either of which a jumper wire can be plugged. By connecting jack 134 or 135 to the appropriate test point of the circuit, via the jumper wire, and properly setting test fixture switches, sections of the circuit being serviced can be calibrated.

Having described our invention as required by 35 USC 112, we claim:

1. A system for testing and servicing a circuit means of an instrument for receiving, producing and/or handling a plurality of signals representative of process measurement and/or control, wherein said instrument has test points, said circuit means is involved in receiving, producing or handling at least a portion of said plurality of signals, said system being of the type comprising means having information for testing and servicing said instrument, including applying probe means to said test points, and a test fixture;

said test fixture having first connecting means for connecting test signals to said instrument such as to cause diagnostic signals to appear at at least certain of said test points, said test fixture have second connecting means for connecting said diagnostic signals to test instrumentation to produce information which, when compared with said testing and servicing information by a human operator, will inform said operator whether or not said instrument be in need or service, and what sort of service, if any be needed;

said first connecting means including switch means and potentiometer means and interconnecting an input voltage to the input of said instrument for causing said circuit means to produce an open loop output voltage in response to said input voltage; said potentiometer means being operable to set the value of said input voltage, and said switch means being operable to simultaneously disconnect said input voltage from said input and close a loop around said circuit;

said second connecting means providing for selectively connecting said input voltage and said output voltage to said test instrumentation, both when said loop is closed and when said loop is open.

2. A system for testing and servicing a circuit means of an instrument for receiving, producing and/or handling a plurality of signals representative of process measurement and/or control, wherein said circuit means is involved in receiving, producing or handling at least a portion of said plurality of signals, said system comprising, in combination, a book, a template, and a test fixture;

said book having information therein for testing and servicing said instrument;

said template having portrayals of portions of said circuit graphically depicted thereon, said template having means for removably mounting said template on said circuit means, and said template, when so mounted, having access means for providing probe access, by probe means, to test points of said circuit means;

said test fixture having first connecting means for connecting test signals to said instrument such as to cause diagnostic signals to appear at at least certain of said test points, said test fixture have second connecting means for connecting said diagnostic signals to test instrumentation to produce information which, when compared with said testing and servicing information by a human operator, will inform said operator whether or not said instrument be in need of service, and what sort of service, if any, be needed, said first connecting means including switch means and potentiometer means and interconnecting an input voltage to the input of said instrument for causing said circuit means to produce an open loop output voltage in response to said input voltage; said potentiometer means being operable to set the value of said input voltage, and swid switch means being operable to simultaneously disconnect said input voltage from said input and close a loop around said circuit;

said second connecting means providing for selectively connecting said input voltage and said output voltage to said test instrumentation, both when said loop is closed and when said loop is open.

3. A test fixture in a system for testing and servicing an instrument for receiving, producing and/or handling a plurality of signals representative of process measurement and/or control, wherein said instrument has test points, said system being of the type comprising means having information for testing and servicing said instrument, including applying probe means to said test points;

said test fixture having first connecting means for connecting test signals to an instrument such as to cause diagnostic signals to appear at at least certain test points of said instrument, said test fixture having second connecting means for connecting said diagnostic signals to test instrumentation to produce information which, when compared with predetermined testing and servicing information by a human operator, will inform said operator whether or not said instrument be in need of service, and what sort of servie, if any, be need;

said first connecting means including switch means and potentiometer means and interconnecting an input voltage to the input of said instrument for causing said instrument to produce an open loop output voltage in response to said input voltage; said potentiometer means being operable to set the value of said input voltage, and said switch means being operable to simultaneously disconnect said input voltage from said input and close a loop around said instrument;

said second connecting means providing for selectively connecting said input voltage and said output voltage to said test instrumentation, both when said loop is closed and when said loop is open.

* * * * *